United States Patent
Nagaoka et al.

(10) Patent No.: US 9,007,777 B2
(45) Date of Patent: Apr. 14, 2015

(54) BOARD MODULE AND FABRICATION METHOD THEREOF

(75) Inventors: Gen Nagaoka, Osaka (JP); Yasuhiro Hida, Osaka (JP); Hiroki Miyazaki, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 399 days.

(21) Appl. No.: 13/498,761

(22) PCT Filed: May 12, 2010

(86) PCT No.: PCT/JP2010/058016
§ 371 (c)(1),
(2), (4) Date: Mar. 28, 2012

(87) PCT Pub. No.: WO2011/040081
PCT Pub. Date: Apr. 7, 2011

(65) Prior Publication Data
US 2012/0182697 A1   Jul. 19, 2012

(30) Foreign Application Priority Data
Sep. 30, 2009 (JP) ................. 2009-225738

(51) Int. Cl.
| | |
|---|---|
| H05K 1/00 | (2006.01) |
| H05K 1/18 | (2006.01) |
| H05K 7/00 | (2006.01) |
| H01L 29/18 | (2006.01) |
| H01L 33/00 | (2010.01) |
| G09G 3/36 | (2006.01) |
| G02F 1/1345 | (2006.01) |
| H01L 23/00 | (2006.01) |

(52) U.S. Cl.
CPC ........ *G02F 1/13452* (2013.01); *G02F 1/13454* (2013.01); *G02F 2202/28* (2013.01); *H01L 24/16* (2013.01); *H01L 24/32* (2013.01); *H01L 2924/01004* (2013.01); *H01L 2924/19105* (2013.01); *H01L 2924/07811* (2013.01)

(58) Field of Classification Search
CPC ............ G02F 1/13452; G02F 1/13454; G02F 2202/28; H01L 2924/19105; H01L 2924/01004; H01L 24/16
See application file for complete search history.

(56) References Cited

U.S. PATENT DOCUMENTS

| | | | |
|---|---|---|---|
| 7,341,642 B2 * | 3/2008 | Kumakura | 156/273.5 |
| 7,647,694 B2 * | 1/2010 | Konishi et al. | 29/832 |
| 2005/0155706 A1 | 7/2005 | Nishida et al. | |
| 2010/0321908 A1 * | 12/2010 | Shiota | 361/771 |

FOREIGN PATENT DOCUMENTS

| | | |
|---|---|---|
| JP | 2000-286298 | 10/2000 |
| JP | 2004-6793 | 1/2004 |
| JP | 2005-268590 | 9/2005 |
| JP | 2006-235295 | 9/2006 |

OTHER PUBLICATIONS

International Search Report mailed Jun. 8, 2010, directed to International Application No. PCT/JP2010/058016; 2 pages.

* cited by examiner

*Primary Examiner* — Hoa C Nguyen
*Assistant Examiner* — Xanthia C Cunningham
(74) *Attorney, Agent, or Firm* — Morrison & Foerster LLP

(57) ABSTRACT

Affixed to a projection (111) of a glass substrate (110) included in a liquid crystal module (100) are a first ACF (150a), which has low surface tack strength but high connection reliability, and a second ACF (150b), which has high component attaching capability attributed to high surface tack strength. With these, an LSI chip (130), electronic components (150), etc., are mounted on the glass substrate (110), so that high-speed electronic component mounting can be achieved while ensuring connection reliability.

7 Claims, 7 Drawing Sheets

FIG. 4

| ACF TYPE | | A | B | C | D | E |
|---|---|---|---|---|---|---|
| SURFACE TACK STRENGTH [KPa] | | 9 | 44 | 114 | 185 | 268 |
| ATTACHING CAPABILITY | TIMER 0 SEC. | X | X | △ | ○ | ○ |
| | TIMER 0.2 SEC. | X | ○ | ○ | ○ | ○ |

BOARD MODULE AND FABRICATION METHOD THEREOF

REFERENCE TO RELATED APPLICATIONS

This application is the national stage under 35 USC 371 of International Application No. PCT/JP2010/058016, filed May 12, 2010, which claims the priority of Japanese Patent Application No. 2009-225738, filed Sep. 30, 2009, the entire contents of which are incorporated herein by reference.

FIELD OF THE INVENTION

The present invention relates to board modules and fabrication methods thereof, more specifically to a board module including electronic components, such as chip capacitors, which are mounted on a glass substrate using an anisotropic conductive adhesive, and also to a fabrication method thereof.

BACKGROUND OF THE INVENTION

Conventionally, when mounting electronic components on a glass substrate or suchlike, an anisotropic conductive film (hereinafter, referred to as an "ACF") is used in some cases. The ACF is often in the form of a sheet or tape, and used as an anisotropic conductive adhesive on a resin sheet or tape called a "separator (or base film)". The anisotropic conductive adhesive is normally used by removing only the separator after thermocompression bonding of the ACF onto a substrate surface (such transfer bonding is referred to as "lamination"). In this manner, the ACF is normally affixed to an entire substrate surface, but it might be affixed for each electronic component (see, for example, Japanese Laid-Open Patent Publication No. 2004-6793). An example of this will be described below with reference to FIG. 8.

FIG. 8 is a schematic top view of a conventional liquid crystal module 600 to be provided in a cell phone or suchlike. As shown in FIG. 8, the liquid crystal module 600 includes two opposingly arranged glass substrates 610 and 615, an LSI chip 630, an FPC board 640, and a plurality of discrete electronic components 650 such as capacitors. Herein, the "liquid crystal module" will refer below to a board module including two opposingly arranged glass substrates, as well as an LSI chip, an FPC board, and electronic components, such as capacitors, mounted on any of the glass substrates, but not including any backlight or polarizing plate.

In a space between the two glass substrates 610 and 615, a display portion 620 is formed with a liquid crystal (not shown) enclosed with a seal material (not shown). The glass substrate 610 has a projection 611 on which are mounted the large-scale integration (hereinafter, referred to as "LSI") chip 630 having a driver function required for driving the display portion 620, the flexible printed circuit (hereinafter, referred to as "FPC") board 640 connected to external electronic equipment, and the discrete electronic components 650, such as capacitors, which are required for operating the LSI chip 630. When a video signal, a control signal, and a source voltage are externally provided to the LSI chip 630 via the FPC board 640, the display portion 620 displays video.

The LSI chip 630 and the FPC board 640 are mounted on the projection 611 using a chip ACF 630a and an FPC ACF 640a, respectively. Moreover, the discrete electronic components 650 are mounted on the projection 611 using component ACFs 650a to be affixed to their respective groups of discrete electronic components 650 adjacent to one another. In this manner, a plurality of component ACFs 650a are required for mounting the discrete electronic components 650 on the projection 611. The component ACFs 650a are affixed to the projection 611 one after another, and therefore, upon affixation of the component ACFs 650a, in some cases, the component ACFs 650a affixed adjacently might contact each other, or the component ACFs 650a might contact the LSI chip 630 and the FPC board 640 which are mounted in advance, so that the affixed component ACFs 650a deviate from their desired positions.

To prevent occurrence of such deviation, it is necessary to ensure sufficient space between affixing positions of adjacent component ACFs 650a. However, ensuring sufficient space between affixing positions of adjacent component ACFs 650a results in an increased area of the projection 611, making it difficult to achieve a reduced frame area of the liquid crystal module 600.

Therefore, focusing attention on the fact that the chip ACFs 630a and the component ACFs 650a can be provided in common, a large sheet of ACF including them is affixed to the projection and used to mount an LSI chip and a plurality of discrete electronic components on the projection, and an FPC board is mounted on the projection further using an FPC ACF 640a on the ACF sheet (see, for example, Japanese Laid-Open Patent Publication No. 2006-235295).

CITATION LIST

Patent Document

Patent Document 1: Japanese Laid-Open Patent Publication No. 2004-6793
Patent Document 2: Japanese Laid-Open Patent Publication No. 2006-235295

SUMMARY OF THE INVENTION

However, the aforementioned conventional configuration using a common sheet of ACF for the chip ACFs 630a and the component ACFs 650a tends to have insufficient tack strength for component attachment. Accordingly, when attempting to mount the discrete electronic components on the projection at high speed (e.g., about 0.1 seconds) using a general mounter, the discrete electronic components might be detached without ever being kept on the projection.

This is due to the glass substrate being harder than the FPC board and the ACF harder than solder paste, so when components are mounted on the glass substrate via the ACF, the adhesive power (tack strength) of the ACF cannot exceed a significant repelling force applied upon release of the components pressed by the mounter.

In this regard, on the other hand, high-speed mounting can be made possible by using an ACF with great tack strength. However, in the case of general ACFs, a trade-off relationship might occur where connection reliability decreases as tack strength increases. For example, in general, ACFs with great tack strength are often flexible (at a low degree of hardness) in nature, and in the case where components are mounted on a glass substrate, higher connection reliability can be achieved by harder ACFs (ACFs at higher degrees of hardness). Accordingly, using an ACF with great tack strength can achieve high-speed mounting, but often easily leads to reduced connection reliability.

Furthermore, in the case where solder paste is used on an FPC board, which is not a hard substrate such as a glass substrate, higher connection reliability can also be often achieved by ACFs, which are harder (at a higher degree of hardness) than the solder paste. Accordingly, using an ACF with great tack strength can similarly achieve high-speed mounting, but often easily leads to reduced connection reliability.

Therefore, an objective of the present invention is to provide a board module including anisotropic conductive films allowing high-speed electronic component mounting while ensuring connection reliability, and also to provide a fabrication method thereof.

A first aspect of the present invention is directed to a board module having a plurality of electronic components mounted on a substrate via anisotropic conductive films, the module comprising:

a substrate having a plurality of lines formed thereon;
a first anisotropic conductive film affixed on the substrate;
a second anisotropic conductive film or nonconductive film affixed on the first anisotropic conductive film; and
electronic components disposed on the second anisotropic conductive film or nonconductive film, subjected to pressure bonding, and thereby connected to the lines at least via conductive particles included in the first anisotropic conductive film, wherein, the first anisotropic conductive film has higher connection reliability than the second anisotropic conductive film or nonconductive film, and the second anisotropic conductive film or nonconductive film has higher surface tack strength than the first anisotropic conductive film.

In a second aspect of the present invention, based on the first aspect of the invention, the first anisotropic conductive film has so high connection reliability that the electronic components can be satisfactorily connected to the lines on the substrate, and the second anisotropic conductive film or nonconductive film has so high surface tack strength that the electronic components can be satisfactorily attached at a predetermined speed by a mounter.

In a third aspect of the present invention, based on the first aspect of the invention, the first anisotropic conductive film has a higher melt viscosity than a melt viscosity of the second anisotropic conductive film or nonconductive film at a temperature for thermocompression bonding to connect the electronic components to the lines.

In a fourth aspect of the present invention, based on the first aspect of the invention, the first anisotropic conductive film has a greater thickness than the second anisotropic conductive film or nonconductive film.

In a fifth aspect of the present invention, based on the first aspect of the invention, the first anisotropic conductive film has a surface tack strength of less than 185 KPa at room temperature, and the second anisotropic conductive film or nonconductive film has a surface tack strength of greater than or equal to 185 KPa at room temperature.

In a sixth aspect of the present invention, based on the first aspect of the invention, the board module further comprises:

a flexible printed circuit board; and
a third anisotropic conductive film affixed to the flexible printed circuit board, wherein, the flexible printed circuit board is connected to the lines at least via conductive particles included in the first and third anisotropic conductive films.

In a seventh aspect of the present invention, based on the first aspect of the invention, the substrate includes a display portion for displaying an image, and the electronic components include drive elements for driving the display portion on the basis of externally provided signals.

In an eighth aspect of the present invention, based on the first aspect of the invention, the first anisotropic conductive film, and the second anisotropic conductive film or nonconductive film are affixed over a predetermined area including the lines.

A ninth aspect of the present invention is directed to a method for fabricating a board module having electronic components mounted on a substrate via anisotropic conductive films, the method comprising:

a preparation step of preparing the substrate having a plurality of lines formed thereon, a predetermined first anisotropic conductive film, and a second anisotropic conductive film or nonconductive film having lower connection reliability and higher surface tack strength than the first anisotropic conductive film;

a first affixation step of affixing the first anisotropic conductive film to the substrate through pressure bonding;

a second affixation step of affixing the second anisotropic conductive film or nonconductive film prepared in the preparation step onto the first anisotropic conductive film; and a mounting step of disposing the electronic components on the second anisotropic conductive film or nonconductive film prepared in the preparation step, and subjecting the components to pressure bonding, thereby connecting the components to the lines at least via conductive particles included in the first anisotropic conductive film.

A tenth aspect of the present invention is directed to a method for fabricating a board module having electronic components mounted on a substrate via anisotropic conductive films, the method comprising:

a preparation step of preparing the substrate having a plurality of lines formed thereon, a predetermined first anisotropic conductive film, and a second anisotropic conductive film having lower connection reliability and higher surface tack strength than the first anisotropic conductive film;

an affixation preparation step of creating a composite anisotropic conductive film by affixing the second anisotropic conductive film or nonconductive film prepared in the preparation step to the first anisotropic conductive film;

an affixation step of affixing the composite anisotropic conductive film created in the affixation preparation step to the substrate through pressure bonding; and a mounting step of connecting the electronic components to the lines via the composite anisotropic conductive film.

According to the first aspect of the present invention, the first anisotropic conductive film has higher connection reliability than the second anisotropic conductive film or nonconductive film, which ensures sufficient connection reliability with the lines on the substrate, and the second anisotropic conductive film or nonconductive film has higher surface tack strength than the first anisotropic conductive film, which makes it possible to achieve high-speed electronic component mounting. Thus, it is possible to ensure both connection reliability and high-speed electronic component mounting capability.

According to the second aspect of the present invention, the first anisotropic conductive film has so high connection reliability that the electronic components can be satisfactorily connected to the lines on the substrate, which ensures great connection reliability, and further, the second anisotropic conductive film or nonconductive film has so high surface tack strength that the electronic components can be satisfactorily attached at a predetermined speed by a mounter, which ensures high-speed electronic component mounting capability.

According to the third aspect of the present invention, the first anisotropic conductive film has a higher melt viscosity than the melt viscosity of the second anisotropic conductive film or nonconductive film, so that, when subjecting electronic components to pressure bonding (permanent pressure bonding), the second anisotropic conductive film or nonconductive film readily flows out from between the components and the lines. As a result, the second anisotropic conductive film or nonconductive film barely remains at connections, so that any adverse effect, such as connection reliability being impaired by any of them, can be reduced.

According to the fourth aspect of the present invention, the first anisotropic conductive film is thicker than the second anisotropic conductive film or nonconductive film, and therefore, the first anisotropic conductive film with higher connection reliability greatly contributes to formation of conductive paths, resulting in increased connection reliability.

According to the fifth aspect of the present invention, the first anisotropic conductive film has a surface tack strength of less than 185 KPa at room temperature, and the second anisotropic conductive film or nonconductive film has a surface tack strength of greater than or equal to 185 KPa at room temperature, so that high connection reliability can be ensured by the first anisotropic conductive film, and even though this does not lead to high-speed electronic component mounting by a mounter, still, the second anisotropic conductive film having a high surface tack strength as mentioned above can ensure sufficiently high-speed electronic component mounting capability.

According to the sixth aspect of the present invention, a third anisotropic conductive film typically suitable for pressure bonding of flexible printed circuit boards is used, so that flexible printed circuit boards can be appropriately subjected to pressure bonding, and both connection reliability and high-speed electronic component mounting capability can be ensured.

According to the seventh aspect of the present invention, the electronic components include drive elements (e.g., an LSI chip) for driving a display portion on the basis of externally provided signals, and therefore, in display board modules such as liquid crystal modules, both connection reliability and high-speed electronic component mounting capability can be ensured.

According to the eighth aspect of the present invention, the first anisotropic conductive film, and the second anisotropic conductive film or nonconductive film are affixed over a predetermined area, and therefore, it is possible to realize a board module for which both connection reliability and high-speed electronic component mounting capability are readily ensured without requiring minute affixing accuracy.

The ninth aspect of the present invention realizes a board module fabrication method including a first affixation step of affixing the first anisotropic conductive film to the substrate through pressure bonding, a second affixation step of affixing the second anisotropic conductive film or nonconductive film onto the first anisotropic conductive film, and an electronic component mounting step, so that the same effect as the effect achieved by the first aspect of the invention can be achieved.

The tenth aspect of the present invention realizes a board module fabrication method including an affixation preparation step of creating a composite anisotropic conductive film by affixing the second anisotropic conductive film or nonconductive film to the first anisotropic conductive film, an affixation step of affixing the composite anisotropic conductive film onto the substrate through pressure bonding, and an electronic component mounting step, so that the same effect as the effect achieved by the first aspect of the invention can be achieved.

BRIEF DESCRIPTION OF THE DRAWINGS

FIG. 4 is a table showing measurement results for component attaching capabilities for a glass substrate, regarding a plurality of ACFs with different surface tack strength in the embodiment.

DETAILED DESCRIPTION OF THE INVENTION

Hereinafter, embodiments of the present invention will be described with reference to the accompanying drawings.

1. First Embodiment 1.1 Configuration of the Liquid Crystal Module

Figure 1:
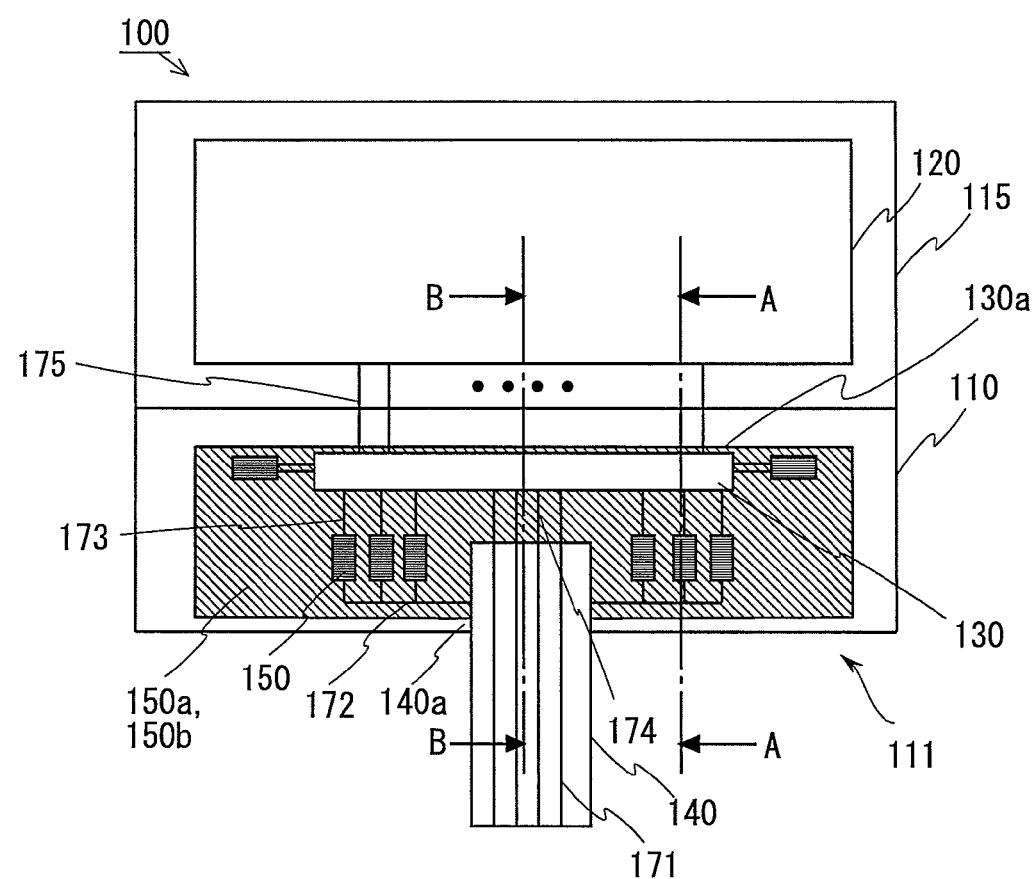
FIG. 1 is a schematic top view illustrating the configuration of a liquid crystal module according to a first embodiment of the present invention.
Figure 2:
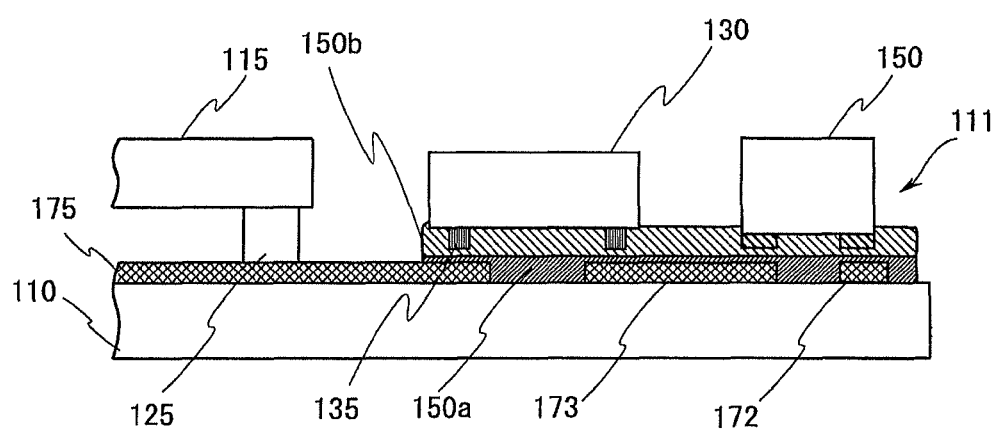
FIG. 2 is a cross-sectional view illustrating in cross-section the liquid crystal module taken along line A-A in FIG. 1.
Figure 3A:
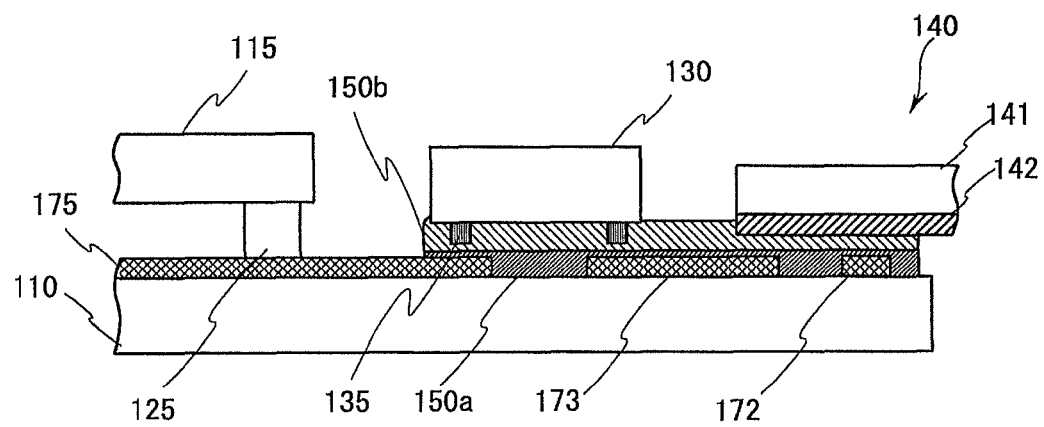
FIG. 3A is a cross-sectional view illustrating in cross-section the liquid crystal module taken along line B-B in FIG. 1.
Figure 3B:
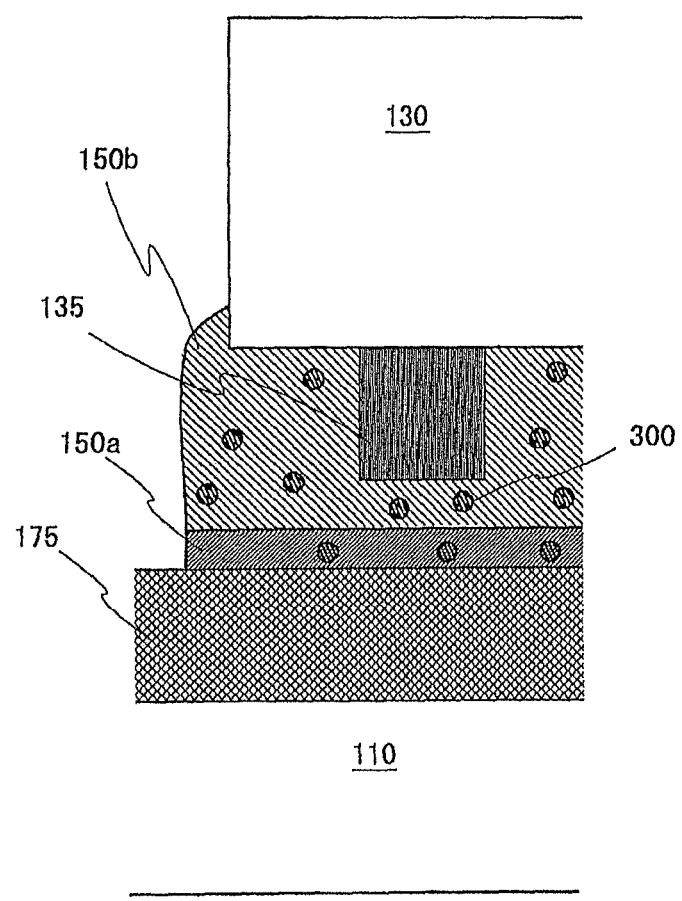
FIG. 3B is a partially expanded view of FIG. 3A.

FIG. 1 is a schematic top view illustrating the configuration of a liquid crystal module 100 as a liquid crystal display device according to a first embodiment of the present invention, FIG. 2 is a cross-sectional view illustrating in cross-section the liquid crystal module 100 taken along line A-A in FIG. 1, FIG. 3A is a cross-sectional view illustrating in cross-section the liquid crystal module 100 taken along line B-B in FIG. 1, and FIG. 3B is a partially expanded view of FIG. 3A. Note that in these figures, components, etc., are shown as being temporarily fixed (attached) for the purpose of describing a structure including ACFs As shown in FIG. 1, the liquid crystal module 100 includes two opposingly arranged glass substrates 110 and 115, an LSI chip 130, an FPC board 140, and electronic components 150 such as stabilizing capacitors and boosting capacitors.

In a space between the two glass substrates 110 and 115, a liquid crystal (not shown) is enclosed with a seal material 125, thereby forming a display portion 120. The glass substrate 110 has a projection 111 on which are mounted the LSI chip 130 having a driver function required for driving the liquid crystal, the FPC board 140 for providing video signals, clock signals, etc., from external electronic equipment to the LSI chip 130, and the electronic components 150, such as stabilizing capacitors and boosting capacitors, which are required for stabilizing voltage generated within the LSI chip 130.

The LSI chip 130 is a bare chip (unpackaged chip) having circuit patterns, including a gate driver, a source driver and a DC/DC converter, formed on the surface of a silicon substrate using micromachining technology and also having formed thereon bump electrodes which function as connecting terminals for connecting the circuit patterns to the outside. For example, the bump electrodes are about 15 µm high. Note that the configurations with the LSI chip 130, which is a bare chip, being bonded face-down to the projection 111 are illustrative, and, for example, an LSI device with the LSI chip 130 packed in a surface-mount package may be mounted on the glass substrate 110.

The FPC board 140 is, for example, a freely bendable board having a plurality of 8 to 50 µm-thick copper foil wiring layers 171 formed on one side of a 12 to 50 μm-thick flexible insulating film 141. Note that the wiring layers 171 may be formed on both sides of the insulating film 141, rather than only on one side. In addition, the electronic components 150 are, for example, ceramic chip capacitors sized 1.0 mm×0.5 mm, which function as, for example, capacitors for stabilizing voltage generated within the LSI chip 130, boosting capacitors to be used for voltage boosting in concert with a boosting circuit (charge pump circuit) included in the LSI chip 130, and capacitors for bypassing power to be supplied to the LSI chip 130. Note that the electronic components 150 may be passive components other than chip capacitors, e.g., chip resistors or chip coils, which function as resistive voltage divider circuits, or may be positive components such as light-emitting diodes (LEDs), rectifying diodes, transistors, or LSI chips. That is, the electronic components herein refer to various electronic components including LSI chips that can be attached by a mounter or suchlike, but not including boards such as the FPC board 140.

The glass substrate 110 has formed thereon display lines 175 for connecting terminals of the LSI chip 130 to the display portion 120, chip component lines 173 for connecting terminals of the electronic components 150 to terminals of the LSI chip 130, a grounding line 172 for grounding other terminals of the electronic components 150, and FPC lines 174 for connecting the wiring layers 171 formed on the FPC board 140 to terminals of the LSI chip 130. These lines 172 to 175 are formed simultaneously with internal lines in the display portion 120, and therefore, are made of a material containing aluminum (Al) or tantalum (Ta).

The LSI chip 130, with the surface directed toward the glass substrate side, is connected at its bump electrode 135 to one end of each of the display lines 175, the chip component lines 173, and the FPC lines 174 via a first ACF 150*a* and a second ACF 150*b*, which are provided in two layers. In addition, the first ACF 150*a* and the second ACF 150*b* provided in two layers are also used to connect the terminals of the electronic components 150 to other ends of the chip component lines 173 or the grounding line 172. Moreover, the wiring layers 171 of the FPC board 140 are connected to other ends of the FPC lines 174 using the first ACF 150*a* and the second ACF 150*b* provided in two layers. In this manner, the first ACF 150*a* and the second ACF 150*b* are shared by the LSI chip 130, the electronic components 150, and the FPC board 140. Note that the first ACF 150*a* and the second ACF 150*b* are, for example, about 10 to 25 μm.

In this case, the first ACF 150*a* and the second ACF 150*b* are vertically laminated to form a two-layer structure, as shown in FIGS. 2 and 3, and have different functions from each other. Details will be described below.

1.2 Method for Fabricating the Liquid Crystal Module

First, a glass substrate 110 is prepared with its projection 111 having display lines 175, chip component lines 173, a grounding line 172, and FPC lines 174 formed thereon. Thereafter, a rectangular ACF, approximately the same size as the projection 111, including an area on which to mount an LSI chip 130 and electronic components 150, intended to be used as a first ACF 150*a* (hence, this ACF will also be referred to below as the "first ACF 150*a*"), is affixed (thermally transferred or laminated) onto the projection 111. Example conditions for affixing the first ACF 150*a* are: temperature 60 to 100° C.; time 1 to 5 seconds; and pressure 0.5 to 2 MPa.

Note that in the configuration described above, the first ACF 150*a* is affixed in a size equivalent to approximately the entire surface of the projection 111 (the same applies to the second ACF 150*b* to be described later), but a discrete ACF may be affixed for each predetermined area of each component required to be connected. However, the above configuration with a sheet of ACF being affixed to approximately the entire surface of the projection 111 is susceptible to any problem even if affixing accuracy is low. Thus, it can be affixed at high speed in a simple manner, and therefore is preferable.

Each of the first ACF 150*a* and the second ACF 150*b* to be described later is in the form of a sheet or tape, and used as an anisotropic conductive adhesive on a separator which is a resin sheet or tape. Note that the following assumes the use of a laminated anisotropic conductive adhesive in which only the separator is removed after thermocompression bonding of the ACF to a substrate surface. Moreover, in the following, providing an ACF on a substrate surface by affixing the ACF to the substrate surface through thermocompression bonding and removing a separator in a manner as mentioned above will be simply expressed by "affixing".

Note that the first ACF 150*a* used has a high degree of hardness for the purpose of enhancing connection reliability with the glass substrate. However, if the ACF has an excessively high degree of hardness, the difference in interface stress between the glass substrate 110 to be bonded and the LSI chip 130, which is, for example, a bare chip, cannot be accommodated, resulting in reduced connection reliability. Specifically, the difference in interface stress due to temperature change is proportional to the difference in thermal expansion coefficient, the glass and the bare chip have approximately equal thermal expansion coefficients (e.g., 3 ppm/° C.), but the ACF has a much higher thermal expansion coefficient (e.g., 100 ppm/° C.). In an attempt to reduce the thermal expansion coefficient of the ACF, adding some modification to, for example, molecular compounding of epoxy resin might excessively enhance the degree of hardness of the ACF, and therefore, to reduce the enhanced degree of hardness, it is generally performed to further add a flexible ingredient such as rubber, thereby reducing the degree of hardness. Accordingly, in this case, low degrees of hardness produce higher connection reliability, and therefore, it cannot necessarily be said that higher degrees of hardness produce higher connection reliability.

Furthermore, the first ACF 150*a* may be structured in two layers, a conductive particle layer provided on the substrate side and an adhesive layer on the chip or component side, or may be provided with only one layer, e.g., a conductive particle layer containing an adhesive.

Next, a second ACF 150*b* having the same shape as the first ACF 150*a* is affixed (thermally transferred or laminated) onto the first ACF 150*a*. Note that the degree of hardness, etc., of the second ACF 150*b* will be described later. Moreover, the conditions for affixing the second ACF 150*b* may be the same as the conditions for affixing the first ACF 150*a* or may be appropriate conditions for bonding the ACFs together.

Subsequently, the LSI chip 130 is temporarily fixed (attached) face-down on the second ACF 150*b*. At this time, the LSI chip 130 is aligned such that the display lines 175, the chip component lines 173, and the FPC lines 174 are connected at one end to their respective bump electrodes 135. Thereafter, the LSI chip 130 temporarily fixed (attached) on the second ACF 150*b* is subjected to permanent pressure bonding (thermocompression bonding). Example conditions for the pressure bonding of the LSI chip 130 are: temperature 180 to 220° C.; time 5 to 15 seconds; and pressure 60 to 80 MPa.

Since the first ACF 150a is affixed below the second ACF 150b, thermocompression bonding of the LSI chip 130 results in excess adhesive, etc., included in the ACFs flowing out from between the bump electrodes 135 and the display lines 175, so that an appropriate amount of conductive particles 300 is trapped therebetween to contribute to electrical connection.

Furthermore, a high-speed mounter is used to temporarily fix (attach) electronic components 150 onto the affixed second ACF 150b. At this time, the electronic components 150 are aligned so as to be connected at one terminal to available ends of the chip component lines 173 and at the other terminal to the grounding line 172, or so as to be connected at opposite terminals to available ends of different chip component lines 173. Example conditions for temporary fixing (attaching) are: time 0.05 to 0.3 seconds; and pressure 1.0 to 4.0 MPa, and the first and second ACFs 150a and 150b are not heated (i.e., they are at room temperature).

Here, in the case where a material with low tack strength is used for the second ACF 150b for the purpose of enhancing connection reliability, as described above (for a layered structure, the material with low tack strength is used as a surface layer), a general high-speed mounter might not be able to appropriately perform the aforementioned temporary fixing. In this regard, any general high-speed mounter can set a timer for a time interval between the descent and ascent of its chip mounter head, and higher timer values can result in higher component fixing (attaching) capabilities. However, higher timer values naturally result in lower mounting speeds. Accordingly, the material of the second ACF 150b is changed between timer values 0 seconds (specifically, less than 0.05 seconds) and 0.2 seconds, thereby changing the tack strength of its surface, and component attaching capabilities for a glass substrate are measured. A description thereof will be given below with reference to FIG. 4.

FIG. 4 is a table showing measurement results for component attaching capabilities for a glass substrate, regarding a plurality of ACFs with different surface tack strength. Note that, here, a general commercially available high-speed mounter was used, and testing was performed as to whether or not a 1005-size chip capacitor could be temporarily fixed (attached) on a glass substrate in order to determine the level of component attaching capability.

Note that in FIG. 4, five ACFs A to E (hereinafter, these ACFs will be indicated as "A" to "E") were used; for the attaching capability level determination results, circles indicate "good", mounted chips being neither loosened nor deviated, crosses indicate "poor", mounted chips being loosened or significantly deviated, and triangles indicate "not completely good", mounted chips being slightly deviated.

Furthermore, for the surface tack strength of the ACFs, a tack strength measuring device (TACKINESS TESTER TAC-II, RHESCA) was set to the conditions: test probe diameter 5 mm; measurement temperature 22° C.; probe descent speed 30 mm/minute; preloading 1922 mN for 1 second; and probe ascent speed 120 mm/minute.

As can be appreciated from FIG. 4, setting the timer value to 0.2 seconds results in good attaching capability of even ACF "B" with relatively low surface tack strength, but the component attaching speed is reduced. Accordingly, to achieve the fastest attaching, the timer value is preferably set to 0 seconds, and in this case, using ACF "C" with a surface tack strength of 114 KPa is not preferable, and it is preferable to use ACF "D" with a surface tack strength of at least 185 KPa or ACF "E" with a surface tack strength of 268 KPa. In this manner, to realize high-speed component mounting and good attaching capability, the second ACF 150b preferably has a surface tack strength of 185 KPa or more at room temperature.

Note that when various conditions, such as temperature conditions and timer values, are different, the second ACF 150b could be satisfactorily attached on the glass substrate even if it does not have a surface tack strength of 185 KPa or more, but even in such a case, the tack strength of the first and second ACFs 150a and 150b needs to meet two conditions as follows.

First, the tack strength of the second ACF 150b has to be so high that good attaching capability can be achieved when electronic components are attached at a predetermined speed by a high-speed mounter. In addition, the tack strength of the first ACF 150a has to be so low that, in the case where that ACF is singly used, attaching electronic components at the aforementioned speed by the high-speed mounter results in poor attaching capability. In this manner, if the tack strength of the first ACF 150a is not low, it is not necessary to ensure connection reliability by the first ACF 150a, and high-speed electronic component mounting capability by the second ACF 150b with higher surface tack strength.

The electronic components 150 temporarily fixed on the second ACF 150b are subjected to permanent pressure bonding to the projection 111. Example conditions for the permanent pressure bonding are: temperature 180 to 200° C.; time 10 to 20 seconds; and pressure 1.0 to 4.0 MPa. Note that in the case where the electronic components 150 are different in height, by pressing the electronic components 150 from their top surfaces using an elastic press head such as rubber, approximately the same pressure can be simultaneously applied to the electronic components 150.

Thereafter, the FPC board 140, with its surface with the wiring layer 142 facing down, is temporarily fixed onto the projection 111. At this time, the FPC board 140 is aligned such that the wiring layer 142 is connected to available ends of the FPC lines 174.

The temporarily fixed FPC board 140 is subjected to permanent pressure bonding. Example conditions for the permanent pressure bonding of the FPC board 140 are: temperature 160 to 190° C.; time 10 to 20 seconds; and pressure 1.5 to 3.0 MPa. Note that all or two of the LSI chip 130, the electronic components 150, and the FPC board 140 (typically, the LSI chip 130 and the electronic components 150) are subjected to permanent pressure bonding in the same or a series of processes.

In the case of using the first and second ACFs 150a and 150b thus affixed to connect the lines to the terminals of the LSI chip, the discrete electronic components, and the FPC board, pressure is applied from above to the components, including the LSI chip, for a predetermined period of time while heating the ACFs, as described above. At this time, the pressure is applied to the two layers of ACF between the terminals of the components, including the LSI chip, and the lines formed on the projection. In the ACFs to which the pressure is applied, dispersed conductive particles are stacked in contact with one another, thereby forming conductive paths, by which the terminals of the LSI chip and the discrete electronic components are connected to their respective lines formed on the glass substrate. The ACFs contain thermosetting resin, and therefore, the formed conductive paths do not disappear after stopping the application of pressure. In this case, pressure is not applied surfacewise, and therefore, no conductive path is formed surfacewise, maintaining surfacewise insulation properties of the ACFs.

Here, it is preferable that the conductive paths as mentioned above be formed mainly by the first ACF 150a. Since the first ACF 150a used can increase connection reliability, as described above, it is desirable that the conductive paths be formed mainly by that, and it can be said that, because the surface tack strength by no means becomes a problem at the time of permanent pressure bonding, the second ACF 150b for increasing the component attaching capability does not have to significantly contribute to increasing connection reliability. Accordingly, the second ACF 150b is preferably thinner (smaller in thickness) than the first ACF 150a, and further, it is more preferable that the second ACF 150b is made as thin (small in thickness) as possible within the extent that sufficient surface tack strength can be obtained for mounting components.

Furthermore, to reduce any adverse effect, such as connection reliability being impaired by the second ACF 150b at the time of permanent pressure bonding, it is preferable to set the melt viscosity of the second ACF 150b (at a temperature for permanent pressure bonding) lower than that of the first ACF 150a, i.e., use a material whose melt viscosity is so low that it flows out to some extent at the time of permanent pressure bonding. By doing so, at the time of permanent pressure bonding, the second ACF 150b flows out from between the terminals of the components, including the LSI chip, and the lines formed on the projection, and barely remains at connections, so that the aforementioned adverse effect can be reduced. Note that the second ACF 150b is preferably made to have a low melt viscosity as described above, and further, to be thin as described above, so that the aforementioned adverse effect can be further reduced.

In this manner, the liquid crystal module 100 can be fabricated with the LSI chip 130, the electronic components 150, and the FPC board 140 being mounted on the projection 111 of the glass substrate 110 and connected by the first and second ACFs 150a and 150b.

1.3 Effect

In the liquid crystal module 100 according to the above embodiment, components, including the electronic components 150, are mounted on the glass substrate 110 using the first ACF 150a with high connection reliability (and low surface tack strength) and the second ACF 150b with high component attaching capability attributed to high surface tack strength, which makes it possible to provide a liquid crystal module with ACFs allowing high-speed electronic component mounting while ensuring connection reliability, and also makes it possible to provide a method for fabricating the same.

2. Second Embodiment 2.1 Configuration of the Liquid Crystal Module

Figure 5:
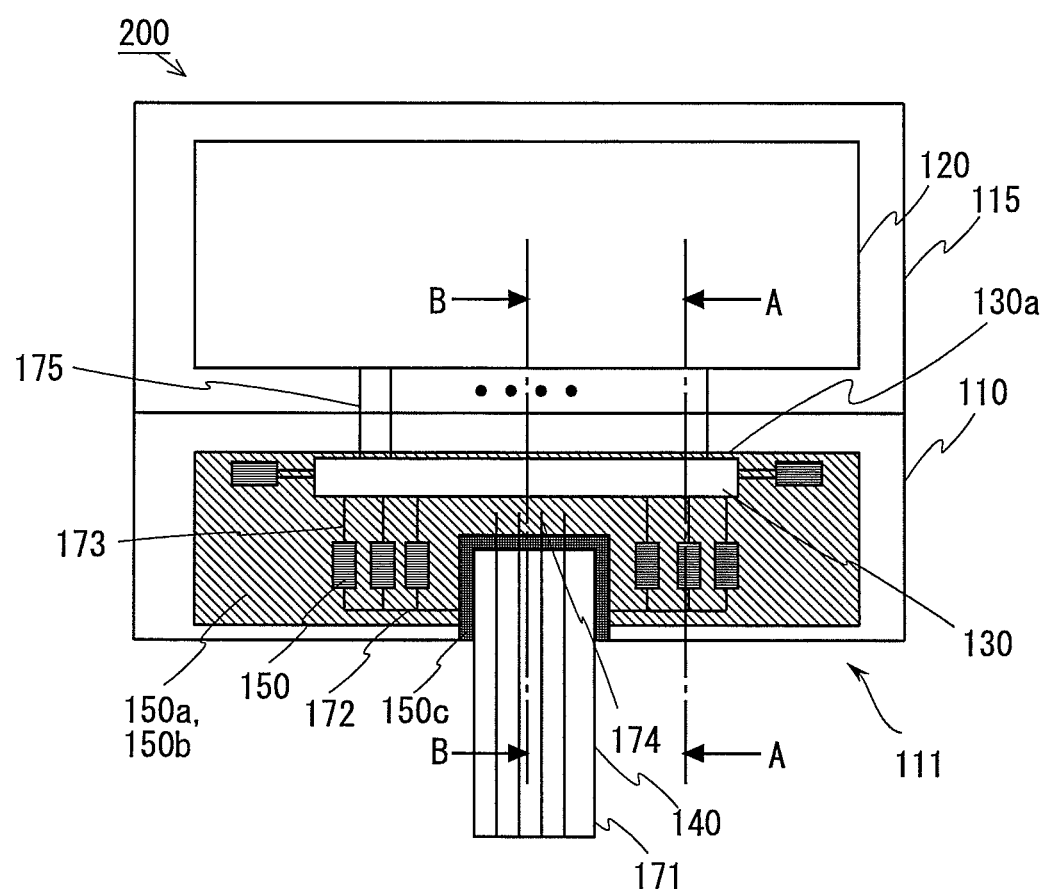
FIG. 5 is a schematic top view illustrating the configuration of a liquid crystal module according to a second embodiment of the present invention.
Figure 6:
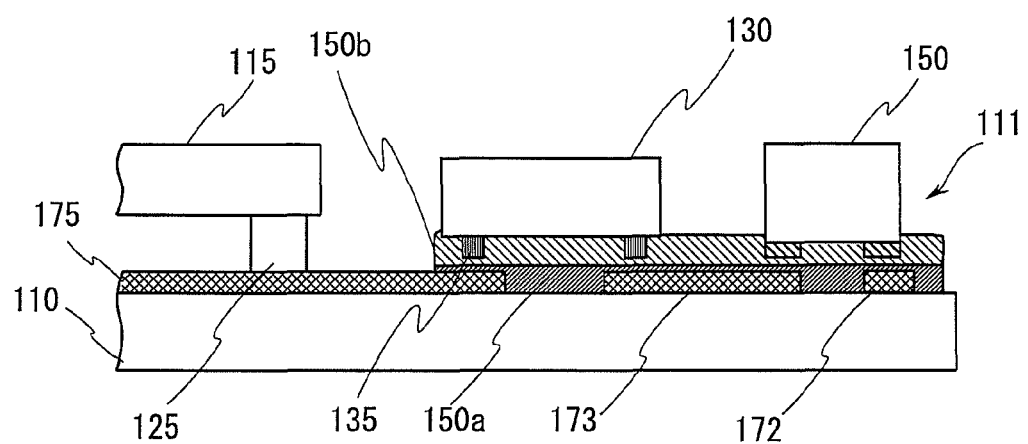
FIG. 6 is a cross-sectional view illustrating in cross-section the liquid crystal module taken along line A-A in FIG. 5.
Figure 7:
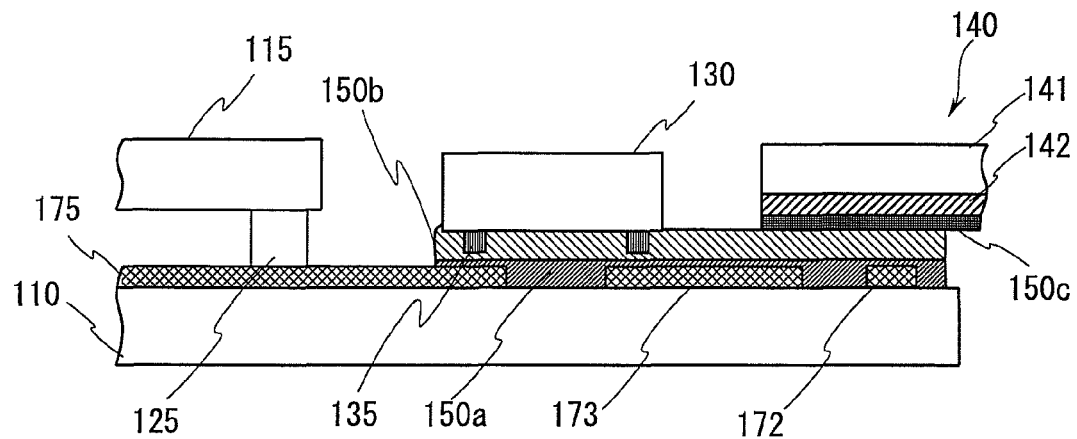
FIG. 7 is a cross-sectional view illustrating in cross-section the liquid crystal module taken along line B-B in FIG. 5.
Figure 8:
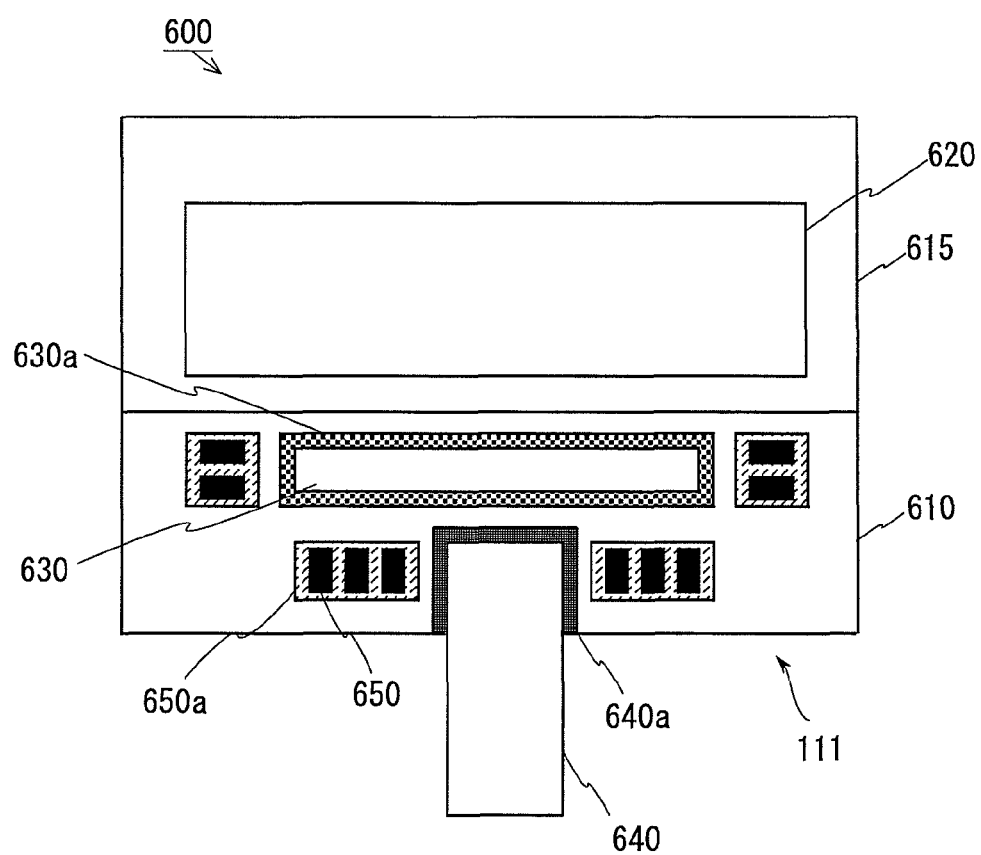
FIG. 8 is a schematic top view of a conventional liquid crystal module.

FIG. 5 is a schematic top view illustrating the configuration of a liquid crystal module 200 as a liquid crystal display device according to a second embodiment of the present invention, FIG. 6 is a cross-sectional view illustrating in cross-section the liquid crystal module 200 taken along line A-A in FIG. 5, and FIG. 7 is a cross-sectional view illustrating in cross-section the liquid crystal module 200 taken along line B-B in FIG. 5. Note that in these figures, components, etc., are shown as being temporarily fixed for the purpose of describing a structure including ACFs.

The liquid crystal module 200 according to the present embodiment shown in FIG. 5 includes approximately the same elements as in the liquid crystal module 100 according to the first embodiment shown in FIG. 1, but differs in that the FPC board 140 is connected not only by the first and second ACFs 150a and 150b but also by a third ACF 150c. Other elements and functions thereof are the same as in the first embodiment, the same elements are denoted by the same characters, and any descriptions thereof will be omitted. Accordingly, the procedure of fabricating the liquid crystal module 200 will be described below, focusing on the process of mounting the FPC board 140 onto the glass substrate 110.

2.2 Method for Fabricating the Liquid Crystal Module

In the second embodiment, as in the first embodiment, the LSI chip 130 and the electronic components 150 are temporarily fixed (attached) onto the glass substrate 110 via the first and second ACFs 150a and 150b, and after permanent pressure bonding, the FPC ACF 150c, approximately the same size as an area of the projection 111 where the FPC board 140 is mounted, is affixed (thermally transferred) to the FPC board 140 in a different process (not shown). The FPC ACF 150c is made of a well-known material particularly suitable for pressure bonding of the FPC board 140 (in terms of its surface tack strength and hardness). Example conditions for affixing the FPC ACF 150a are: temperature 60 to 100° C.; time 1 to 5 seconds; and pressure 0.5 to 2 MPa.

Thereafter, the FPC board 140 with the FPC ACF 150c affixed thereto is temporarily fixed onto the projection 111 with the FPC ACF 150c facing down. At this time, the FPC board 140 is aligned such that its wiring layer 142 is connected to available ends of the FPC line 174. The temporarily fixed FPC board 140 is then subjected to permanent pressure bonding. Example conditions for permanent pressure bonding of the FPC board 140 are: temperature 160 to 190° C.; time 10 to 20 seconds; and pressure 1.5 to 3.0 MPa. Note that as in the first embodiment, all or two of the LSI chip 130, the electronic components 150, and the FPC board 140 (typically, the LSI chip 130 and the electronic components 150) are subjected to permanent pressure bonding in the same or a series of processes.

In this manner, the liquid crystal module 200 can be fabricated with the LSI chip 130, the electronic components 150, and the FPC board 140 being mounted on the projection 111 of the glass substrate 110, in which the LSI chip 130 and the electronic components 150 are connected by the first and second ACFs 150a and 150b, and the FPC board 140 is connected by the first, second, and third ACFs 150a, 150b, and 150c.

2.3 Effect

The liquid crystal module 200 according to the above embodiment makes it possible to provide a liquid crystal module with the first and second ACFs 150a and 150b allowing high-speed electronic component mounting while ensuring connection reliability, as in the first embodiment, and the FPC ACF 150c allowing appropriate pressure bonding of the FPC board 140, and the module also makes it possible to provide a method for fabricating the same.

3. Variants 3.1 Primary Variants

In the first embodiment, the FPC board 140 is connected to the glass substrate 110 via the first and second ACFs 150a and 150b, but in the case where signals are provided to the LSI chip 130 on the glass substrate 110 via an element (e.g., an optical communication unit) other than the FPC board, the FPC board can be omitted. Alternatively, the FPC board 140 can be connected to the glass substrate 110 by a connection method (e.g., connectors) without using ACFs. Thus, the FPC board 140 is not considered as an indispensable component for the liquid crystal module 100, and therefore, it may be omitted.

In the first and second embodiments, the first and second ACFs 150*a* and 150*b* are sequentially affixed to the glass substrate 110, and thereafter, components, such as the electronic components 150, are temporarily fixed (attached), and then subjected to permanent pressure bonding, but instead of doing so, the first and second ACFs 150*a* and 150*b* may be combined together to form a single composite ACF having a layered structure, which is affixed to the glass substrate 110.

Here, the ACFs are normally fabricated (typically, by an ACF manufacturer) in a process different from the process for fabricating the liquid crystal module, and in this different process, for example, sheets of first and second ACFs 150*a* and 150*b* may be laminated (combined) and wound on a reel while being slit to a predetermined width, thereby manufacturing a single ACF tape.

In a process different from the aforementioned process, the first ACF 150*a* and the second ACF 150*b* may be prepared in the form of (reeled) tapes (typically, they are purchased from an ACF manufacturer), and laminated (combined) while being unwound from the reels, and the first and second ACFs 150*a* and 150*b* combined (as one) are affixed to the glass substrate 110. Note that the second ACF 150*b* may be an NCF, as described above. This fabrication method can omit a part of the process of affixing the first and second ACFs 150*a* and 150*b* to the glass substrate 110, where the first and second ACFs 150*a* and 150*b* are separately cut in accordance with the size of the projection 111 of the glass substrate 110.

3.2 Other Variants

While the embodiments have been described with respect to the liquid crystal display device, the liquid crystal display device is not restrictive, and board modules as used in various display devices using glass substrates, such as organic or inorganic EL (Electro Luminescence) displays, plasma display panels (PDPs), and field emission displays (FEDs), can be similarly employed.

While the embodiments have been described with respect to examples where components, such as electronic components, are mounted on the glass substrate 110, a hard substrate made of another material or a soft substrate, e.g., an FPC board including hard portions such as soldered portions, may be used in place of the glass substrate 110. The first ACF 150*a* has high connection reliability even for such substrates, the second ACF 150*b* has high component attaching capability attributed to high surface tack strength, and in the case of using them to mount components, such as the electronic components 150, on any of the substrates as mentioned above, it is similarly possible to achieve high-speed electronic component mounting while ensuring connection reliability.

Furthermore, regardless of the substrate hardness, it is conceivable in some cases that the ACFs might not exhibit both high connection reliability and high component attaching capability at the same time. For example, in the case where an additive is used to ensure adhesiveness between the substrate and the ACFs, it is conceivable that increasing the additive (i.e., increasing connection reliability) reduces tack strength. In such a case also, when components, such as the electronic components 150, are mounted on the substrate via the first ACF 150*a* with high connection reliability and the second ACF 150*b* with high component attaching capability attributed to high surface tack strength, it is possible to achieve high-speed electronic component mounting while ensuring connection reliability. Thus, in the case where there is such a tradeoff between high connection reliability and high component mounting capability, the present invention can be widely applied to board modules including any substrates (of any level of hardness).

The embodiments have been described with respect to the liquid crystal modules in which the LSI chip 130, the FPC board 140, and the electronic components 150 mounted on the glass substrate 110. However, the present invention is not limited to display devices, such as liquid crystal modules, and can be widely applied to board modules on which either the LSI chip 130 or the electronic components 150, or both, is/are mounted, and which is connected to the component(s) by ACFs allowing high-speed electronic component mounting while ensuring connection reliability as mentioned above.

The present invention is applied to board modules, such as liquid crystal panels, and fabrication methods thereof, and more specifically, the invention is suitable for a board module including electronic components, such as chip capacitors, mounted on a glass substrate using an anisotropic conductive adhesive, and a fabrication method thereof.

DESCRIPTION OF THE REFERENCE CHARACTERS

100, 200 liquid crystal module
110, 115 glass substrate
111 projection
115 separator
120 display portion
130 LSI chip
140 FPC board
150 electronic component
150*a* first ACF
150*b* second ACF
150*c* FPC ACF

The invention claimed is:

1. A board module having a plurality of electronic components mounted on a substrate via anisotropic conductive films, the module comprising:
   a glass substrate having a plurality of lines formed thereon;
   a first anisotropic conductive film affixed on the glass substrate;
   a second anisotropic conductive film or nonconductive film affixed on the first anisotropic conductive film; and
   electronic components disposed on the second anisotropic conductive film or nonconductive film, subjected to pressure bonding, and thereby connected to the lines at least via conductive particles included in the first anisotropic conductive film,
   wherein the first anisotropic conductive film has higher connection reliability than the second anisotropic conductive film or nonconductive film,
   the second anisotropic conductive film or nonconductive film has higher surface tack strength than the first anisotropic conductive film, and
   the first anisotropic conductive film has a higher melt viscosity than a melt viscosity of the second anisotropic conductive film or nonconductive film at a temperature for thermocompression bonding to connect the electronic components to the lines.

2. The board module according to claim 1, wherein,
the first anisotropic conductive film has so high connection reliability that the electronic components can be satisfactorily connected to the lines on the glass substrate, and
the second anisotropic conductive film or nonconductive film has so high surface tack strength that the electronic components can be satisfactorily attached at a predetermined speed by a mounter.

3. The board module according to claim 1, wherein the first anisotropic conductive film has a greater thickness than the second anisotropic conductive film or nonconductive film.

4. The board module according to claim 1, wherein,
the glass substrate includes a display portion for displaying an image, and
the electronic components include drive elements for driving the display portion on the basis of externally provided signals.

5. The board module according to claim 1, wherein the first anisotropic conductive film, and the second anisotropic conductive film or nonconductive film are affixed over a predetermined area including the lines.

6. A board module having a plurality of electronic components mounted on a substrate via anisotropic conductive films, the module comprising:
a glass substrate having a plurality of lines formed thereon;
a first anisotropic conductive film affixed on the glass substrate;
a second anisotropic conductive film or nonconductive film affixed on the first anisotropic conductive film; and
electronic components disposed on the second anisotropic conductive film or nonconductive film, subjected to pressure bonding, and thereby connected to the lines at least via conductive particles included in the first anisotropic conductive film,
wherein the first anisotropic conductive film has higher connection reliability than the second anisotropic conductive film or nonconductive film,
the second anisotropic conductive film or nonconductive film has higher surface tack strength than the first anisotropic conductive film,
the first anisotropic conductive film has a surface tack strength of less than 185 KPa at room temperature, and
the second anisotropic conductive film or nonconductive film has a surface tack strength of greater than or equal to 185 KPa at room temperature.

7. A board module having a plurality of electronic components mounted on a substrate via anisotropic conductive films, the module comprising:
a glass substrate having a plurality of lines formed thereon;
a first anisotropic conductive film affixed on the glass substrate;
a second anisotropic conductive film or nonconductive film affixed on the first anisotropic conductive film;
electronic components disposed on the second anisotropic conductive film or nonconductive film, subjected to pressure bonding, and thereby connected to the lines at least via conductive particles included in the first anisotropic conductive film;
a flexible printed circuit board; and
a third anisotropic conductive film affixed to the flexible printed circuit board,
wherein the first anisotropic conductive film has higher connection reliability than the second anisotropic conductive film or nonconductive film,
the second anisotropic conductive film or nonconductive film has higher surface tack strength than the first anisotropic conductive film, and
the flexible printed circuit board is connected to the lines at least via conductive particles included in the first and third anisotropic conductive films.

* * * * *